United States Patent [19]

Melbert

[11] Patent Number: 4,831,323

[45] Date of Patent: May 16, 1989

[54] VOLTAGE LIMITING CIRCUIT

[75] Inventor: Joachim Melbert, Steinhöring, Fed. Rep. of Germany

[73] Assignee: SGS Halbleiter-Bauelemente GmbH, Grafing, Fed. Rep. of Germany

[21] Appl. No.: 943,080

[22] Filed: Dec. 18, 1986

[30] Foreign Application Priority Data

Dec. 19, 1985 [DE] Fed. Rep. of Germany ....... 3545039

[51] Int. Cl.$^4$ .......................... G05F 3/26; H02H 9/04
[52] U.S. Cl. .................................. 323/311; 323/315;
  361/90; 361/91; 361/111
[58] Field of Search ................................ 323/311–315,
  323/907; 307/296 R, 297; 330/256, 257, 288;
  361/90, 91, 111

[56] References Cited

U.S. PATENT DOCUMENTS

| | | | |
|---|---|---|---|
| 3,691,426 | 9/1972 | Mankovitz | 323/311 X |
| 4,123,698 | 10/1978 | Timko et al. | |
| 4,422,033 | 12/1983 | Minner et al. | 323/907 X |
| 4,435,678 | 3/1984 | Joseph et al. | 323/315 X |
| 4,475,077 | 10/1984 | Nagano | 323/312 |
| 4,507,573 | 3/1985 | Nagano | 323/315 X |
| 4,528,496 | 7/1985 | Naokawa et al. | 323/315 |
| 4,647,840 | 3/1987 | Hiyama | 323/907 X |
| 4,677,368 | 6/1987 | Bynum | 323/311 |
| 4,704,654 | 11/1987 | Aberle et al. | 361/90 |

FOREIGN PATENT DOCUMENTS 2730314 1/1978 Fed. Rep. of Germany.
3404317 8/1985 Fed. Rep. of Germany.
3531645 5/1987 Fed. Rep. of Germany.

Primary Examiner—Peter S. Wong
Assistant Examiner—Emanuel Todd Voeltz
Attorney, Agent, or Firm—Burns, Doane, Swecker & Mathis

[57] ABSTRACT

A voltage limiting circuit with two-terminal network character is described which has a sharp-edged limitation characteristic curve and a short response time. According to the invention, this is achieved by means of two current mirror circuits connected to each other in a ring circuit, with a clamping transistor being at the same time a transistor of one of these current mirror circuits. A biasing current is fed from a current source into the remaining elements of the two current mirror circuits, this biasing current subjecting the semiconductor junctions of these current mirror elements to current and charging the diffusion and depletion layer capacitances thereof already prior to the limitation onset. The consequence thereof is a rapid limitation effect when the limit voltages are being reached. The effect achieved by means of a biasing voltage source between the two current mirror elements of the current mirror circuit containing the clamping transistor is that the input current received by the voltage limiting circuit in the non-limiting voltage range remains much smaller than the biasing current fed into the ring circuit.

15 Claims, 3 Drawing Sheets

VOLTAGE LIMITING CIRCUIT

The present invention relates to a voltage limiting circuit, particularly to a voltage limiting circuit which is adapted to be connected in parallel, as a two-terminal network, to a voltage source to be limited and having an internal resistance, and which includes a clamping transistor having a voltage-limiting effect on the voltage source.

Voltage limiting circuits are employed for limiting the voltage supplied from a voltage source to a load to a specific voltage value. The voltage limitation may start at a lower voltage value or at an upper voltage value. It is, however, also possible to carry out limitation both to a lower voltage value and to an upper voltage value, and for this purpose one frequently combines a circuit limiting to a lower voltage value with a circuit limiting to an upper voltage value.

An ideal limiting circuit can be described simply on the basis of its two-terminal network characteristics. In doing so, the input current I is represented as a function of the voltage V applied. The ideal limiting two-terminal network has, before limitation onset, an infinite internal resistance and an input current 0 and, starting from limitation onset, an internal resistance 0 and an input current which is limited by the external wiring means.

Such a circuit is capable of keeping undesired voltage values exceeding the limit voltage, away from subsequent circuit units. A lower limit voltage of $V_{MIN}=0$ is selected for a multiplicity of practical applications.

An example for a possible use of such a limiting circuit is the protection of the input of a MOS circuit, for instance of a microcomputer that controls the functions of a motor vehicle, against disturbing voltages exceeding a limit value. Even though such disturbing voltages do not lead to damage of the MOS circuit, they may nevertheless cause control function errors of this circuit. In order to prevent this, the limiting circuit is to change into the limiting state as abruptly and rapidly as possible.

Limiting can be achieved in a simple manner by means of a Zener diode. The upper limitation threshold then corresponds to the Zener voltage and the lower limitation threshold corresponds to the forward voltage of the Zener diode. It is also possible to employ a series connection of two Zener diodes for the upper and the lower limitation threshold.

For many applications, the forward voltage and especially the Zener voltage differs too much from the desired limitation volta $V_{MIN}=0$, $V_{MAX}>0$. Furthermore, the finite current that flows through the circuit before the limitation threshold is reached frequently is not acceptable. In case of high-impedance voltage sources this finite current that flows through the limiting circuit below the limitation threshold leads to the result that the voltage reaching the load circuit differs from the nominal voltage of the voltage source, although the limiting circuit should be of no influence in this voltage range.

An improvement of the limiting characteristic can be achieved with the aid of an active limiting circuit in which the base-to-emitter path of a clamping transistor is connected in parallel to the two poles of the voltage source, the collector of said clamping transistor being connected to a supply voltage source feeding the limiting circuit. The limitation threshold is determined by the switching-on threshold of the transistor. The switching-on threshold may be shifted by means of an auxiliary voltage source connected upstream of the base of the transistor. When, for instance, an auxiliary voltage of 0.3 V is selected, a limitation threshold is reached at −0.3 V when the switching-on threshold of the transistor is 0.6 V. It is in general ensured with this limitation threshold that, e.g. in integrated circuits connected downstream of the limiting circuit, there is no substrate diode carrying an inadmissibly high current at the input, which could disturb the function of the integrated circuit.

A disadvantage of this active limiting circuit is the relatively strong temperature-dependence of the limitation onset as well as the finite current in the non-limiting voltage range. Apart from this, the internal resistance in the limitation range is clearly different from 0. Moreover, the limitation characteristic greatly differs from the desired abrupt behavior.

The problem to be solved by the invention is to make available a voltage limiting circuit with a limitation onset that is rapid, sharp-edged and less dependent upon temperature.

The solution to this problem is a voltage limiting circuit which is adapted to be connected in parallel, as a two-terminal network to a voltage source to be limited and having an internal resistance, and which includes a clamping transistor having a voltage-limiting effect on the voltage source, characterized in that a ring circuit is provided which has two current mirror circuits which are fed back in themselves, a first current mirror circuit thereof including the clamping transistor and being connected with its terminals not participating in the ring circuit to one of the two poles of the voltage source each, and the second current mirror circuit being connected with its terminals not participating in the ring circuit to a supply voltage source, that a first current source is provided which is connected to the ring circuit and feeds a biasing current effecting short response times into the current mirror elements of the second current mirror circuit and into the diode means of the first current mirror circuit, and in that the control electrode of the clamping transistor has an auxiliary voltage source connected upstream thereof which is dimensioned such that, until the limitation starting point is reached, an input current flows which is considerably smaller than the biasing current.

As a consequence of the use of two current mirror circuits that are connected to each other in the form of a ring circuit, there is, at a specific voltage value of the voltage source that is influenced by the auxiliary voltage, a regenerative feedback in the ring circuit which results in an increasing current in the clamping transistor participating in the ring circuit. The result thereof is an abruptly beginning high input current of the limiting circuit and, thus, a sharp-edged limitation onset, i.e. beginning of the limiting operation, as well as a very low internal resistance of the limiting circuit in the limiting operation.

In a particularly preferred manner, the transistors of the second current mirror circuit are of a conductivity type that is complementary to the conductivity type of the transistors of the first current mirror circuit.

With the aid of the first current source, a biasing current is fed into the ring circuit through which the semiconductor junctions and the internal diffusion and depletion layer capacitances of the current mirror elements of the ring circuit, with the exception of the clamping transistor, are subjected to current and charged, respectively, before the beginning of the regenerative feedback, i.e. already in the non-limiting operation of the limiting circuit. The limiting circuit is thereby capable of beginning the limiting operation in rapid manner when the limit voltage is being reached. Temporary exceeding of the limit voltage, as it would occur without this biasing current since, upon flow of current, first the semiconductor junctions would have to be subjected to current and the diffusion and depletion layer capacitances would have to be charged, is thus avoided or at least greatly reduced in terms of time.

When the limiting circuit according to the invention is to be monolithically integrated, there are problems arising with regard to the realization of the auxiliary voltage source. An external auxiliary voltage source would necessitate that the circuit points to be connected to the two poles of the auxiliary voltage source are extended outwardly to two additional terminal pins, which in general is not very desirable.

In a particularly preferred embodiment of the invention that is especially suitable for monolithic integration, the auxiliary voltage is generated with the aid of unequal voltage drops across various diodes operated with different current densities. For this purpose the various diodes are subjected to differing currents and/or formed with differing active semiconductor areas. As the voltage drop across a diode increase so does the current density of the diode.

In a particularly preferred embodiment comprising an auxiliary voltage source utilizing this phenomenon, the control electrode of the clamping transistor has a diode means, preferably in the form of a first diode, connected upstream thereof, and furthermore, there is provided a diode series connection which is connected between the terminal of the first diode not connected to the clamping transistor and the pole of the voltage source not connected to the clamping transistor, and which includes a second and a third diode, with the voltage drop across the first diode being different from the voltage drop across the diode series connection in such a manner that a voltage difference arises between the voltage drops across the first diode and across the diode series connection, so that the current flowing through the clamping transistor, which current is responsive to the base-to-emitter voltage remaining for the clamping transistor, until limitation onset is considerably smaller than the biasing current preparing the remaining current mirror elements for rapid switching-on. This can be achieved by using different types of diodes or, in a preferred manner, by operating the first diode with a different current density than the diodes of the diode series connection. When the voltage limiting circuit is to effect a limitation at a voltage minimum which is somewhat below 0 V, the first diode is operated with a greater current density than the diodes of the diode series connection.

A reduced base-to-emitter voltage of the clamping transistor before limitation onset is achieved by suitable current densities (a high current density in the first diode and a low current density in the diodes of the diode series connection).

This leads to the desired minimum current in the clamping transistor and thus to a minimum input current of the limiting circuit although a sufficiently large current flows through the remaining elements of the limiting circuit so that these are prepared for a rapid limitation onset.

The differing current density is effected in a preferred manner both by current application of differing intensity and by differing active semiconductor areas.

In order to operate the first diode with a greater current than the diode series connection, a particularly preferred embodiment has a second current source which is connected between the terminal of the first diode connected to the clamping transistor and the pole of the voltage source not connected to the clamping transistor, and which delivers a specific fraction of the current of the first current source. In preferred manner, this second current source is realized with the aid of a third current mirror circuit whose one current branch is connected to the first current source and whose other current branch is connected between the first diode and the voltage source pole not connected to the clamping transistor. The effect achieved by means of differently sized active semiconductor areas of the two current mirror elements is that a lower current than that supplied by the first current source is applied to the first diode.

The one current branch of the third current mirror circuit can also be connected via the main current path of an additional transistor to the supply voltage source, the base of this additional transistor being connected both to the base interconnection of the second current mirror circuit and to the first current source.

The voltage limiting circuit according to the invention is preferably realized with bipolar transistors. When a voltage limitation is required at a lower voltage value, the first current mirror circuit is constructed with npn transistors and the second current mirror circuit is constructed with pnp transistors. When a voltage limitation is required at an upper voltage value, transistors of opposite conductivity type are employed each. For a voltage limiting circuit that is to perform limitation both at a lower and at an upper voltage value, two voltage limiting circuits according to the invention which have transistors of opposite type are combined.

The present invention provides a voltage limiting circuit having a sharp-edged limitation characteristic curve and a short response time. According to the invention, this is achieved by means of two current mirror circuits connected to each other in the form of a ring circuit, with a clamping transistor being at the same time a transistor of one of these current mirror circuits. A current source is used to supply a biasing current to the remaining elements of the two current mirror circuits, this biasing current subjecting the semiconductor junctions of these current mirror elements to current and charging the diffusion and depletion layer capacitances thereof already prior to the limitation onset. The consequence thereof is a rapid limitation onset upon reaching of the limit voltages. By providing a biasing voltage source between the two current mirror elements of the current mirror circuit including the clamping transistor, one obtains the result that the input current which the voltage limiting circuit receives in the non-limiting voltage range from the voltage source to be limited remains much smaller than the biasing current fed into the ring circuit.

Instead of a differing current density distribution in the diodes forming the auxiliary voltage source, the voltage difference on these diodes may also be realized by different diode types. For instance, it is possible to use Schottky diodes for one or for both diodes of the diode series connection.

The invention and developments of the invention shall now be explained in more detail by way of preferred embodiments with reference to the accompanying drawings in which.

Figure 1:
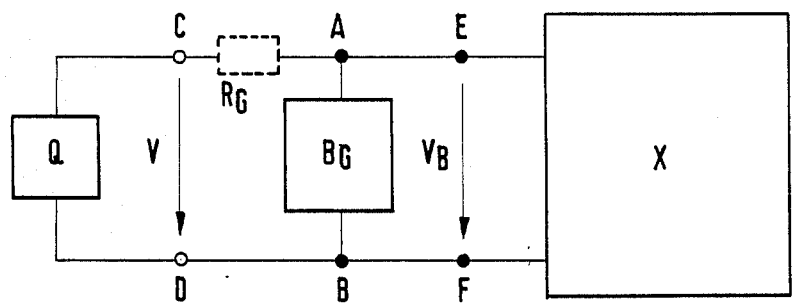
FIG. 1 shows a fundamental circuit diagram with a limiting dipole.

The fundamental diagram of FIG. 1 shows a voltage limiting circuit BG in the form of a two-terminal network, which, at the circuit points A, B, is connected in the form of a parallel connection between the output C, D of a voltage source Q and the input E, F of a load circuit X. The voltage source Q delivers a voltage V and the load circuit X receives a voltage $V_B$.

Between the output C and the circuit point A there is connected a limiting resistor $R_G$ which, in the event of a limiting operation, ensures that the current flowing through the voltage limiting circuit BG does not become too high. When the voltage source Q has a sufficiently high internal resistance, the limiting resistor $R_G$ may be omitted.

Figure 2:
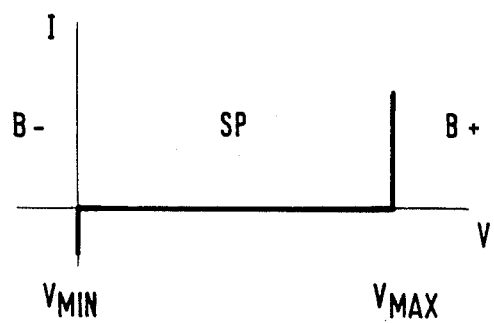
FIG. 2 illustrates an ideal characteristic curve of a voltage limiting circuit limiting both to a lower voltage value and to an upper voltage value.

FIG. 2 shows a characteristic curve of the limiting two-terminal network BG. In a blocking range SP the limiting network BG represents in the ideal case an infinite resistance and, thus does not cause any influence. The input voltage VB of the load circuit X is then equal to the output voltage V of the voltage source Q.

In FIG. 2 it is assumed that the limiting network BG has a lower limitation threshold $V_{MIN}$ and an upper limitation threshold $V_{MAX}$. Upon reaching one of these two limitation thresholds, the internal resistance of the limiting network BG changes in the ideal case abruptly from infinite to 0. When the voltage passes into the lower limitation range B− or into the upper limitation range B+, respectively, the result thereof is in the ideal case an infinite current through the limiting network. However, in reality this current is limited by the internal resistance of the voltage source Q or by the limiting resistor $R_G$. The input voltage VB of the load circuit X is thus limited to the minimum voltage $V_{MIN}$ and the maximum voltage $V_{MAX}$, respectively.

The embodiments of voltage limiting circuits according to the invention, as they are described hereinafter, are close to the ideal characteristic curve according to FIG. 2.

Figure 3:
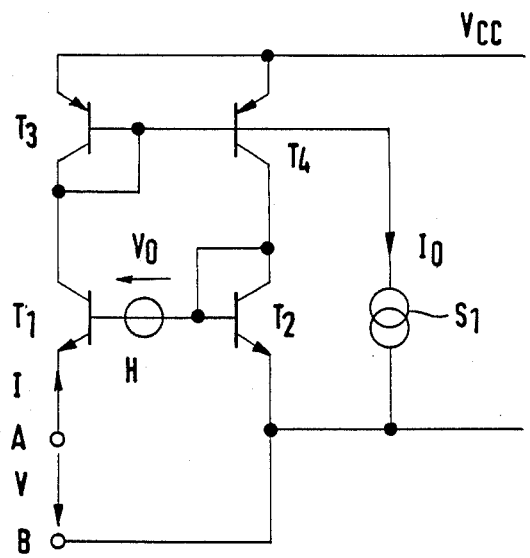
FIG. 3 illustrates a first embodiment of a voltage limiting circuit according to the invention.

The embodiment of the invention shown in FIG. 3 displays a first current mirror circuit having a clamping transistor $T_1$ and a transistor $T_2$ which is connected as a diode, with the base terminals of said transistors being connected to each other via an auxiliary voltage source H. The emitters of transistors $T_1$ and $T_2$ are connected to circuit points A and B, respectively.

This voltage limiting circuit comprises a second current mirror circuit having a transistor $T_3$ as a diode, as well as a transistor $T_4$. The emitters of transistors $T_3$ and $T_4$ are connected to each other and to a supply voltage source Vcc. The collectors of transistors $T_3$ and $T_4$ are connected to the collectors of transistors $T_1$ and $T_2$, respectively. The interconnected base terminals of transistors $T_3$ and $T_4$ are connected via a first current source $S_1$ to circuit point B.

The transistors $T_3$ and $T_4$ of the second current mirror circuit are of a conductivity type which is complementary to the conductivity type of the transistors $T_1$ and $T_2$ of the first current mirror circuit.

The following discussion of the mode of operation of this voltage limiting circuit starts with the assumption that the auxiliary voltage Vo of the auxiliary voltage source H and the current Io of the current source $S_1$ are both 0. This means that it is first assumed that the current source $S_1$ is not present and that the base terminals of transistors $T_1$ and $T_2$ are directly connected to each other.

Under these operating conditions, the following equation holds:

$$V_{BE1} = V_{BE2} - V \quad (Io=0, Vo=0) \tag{1}$$

Under the conditions mentioned, the voltage limiting circuit is without current when V>0, i.e. I=0.

The two current mirror circuits including the transistors $T_1$, $T_2$ and $T_3$, $T_4$, respectively, are connected to each other in a ring circuit. The transfer ratios of the two current mirror circuits result from the ratios of their emitter areas. The transfer ratio of the upper current mirror circuit $T_3$, $T_4$ is:

$$a = \frac{A_{E,T4}}{A_{E,T3}} \tag{2}$$

The transfer ratio of the lower current mirror circuit with the transistors $T_1$ and $T_2$ is:

$$b = \frac{A_{E,T1}}{A_{E,T2}} \tag{3}$$

In these equations $A_{E,T1}$ to $A_{E,T4}$ are the emitter areas of transistors $T_1$ to $T_4$.

In this respect, the current gain B of the transistors is assumed to be very large at all times.

Under the condition V=0 and Io=0, the circuit forms, when a=1 and b=1, a closed ring having a ring amplification $$V_R = a \cdot b = 1. \tag{4}$$

In case of an ideal realization, the stability condition is thus violated and the input current I of the voltage limiting circuit may assume arbitrary values so that the input resistance $R_I = V/I$ becomes 0. In the case of a real circuit, limitation of the current is effected due to parasitic series resistors.

It is possible to adjust a ring amplification $a \cdot b < 1$ by changing the ratios of the emitter areas, so that the circuit becomes stable and currentless for V=0. The critical regenerative feedback, at which an abrupt increase of the input current I occurs, then starts only when the negative input voltage $$V = v_K = -V_T \ln(a \cdot b) \quad (V_T: \text{temperature voltage}) \tag{5}$$

is present.

However, a realization of the voltage limiting circuit without the current source $S_1$ is conflicting with the dynamic behavior thereof. Due to the fact that all semiconductor junctions are without current up to the point of regenerative feedback, all internal diffusion and depletion layer capacitances are discharged. These capacitances are charged only with the onset of the limitation, which leads to a delayed limitation effect of the circuit. In case of rapid voltage transitions from the blocking range SP into the limitation range B− or B+, the voltage limit values will therefore be exceeded for a short period of time. These short-time excess voltages may cause error signals in the subsequent load circuit X, such as e.g. a microprocessor constructed in MOS technology, and they can thus cause erroneous control of the apparatus, such as e.g. the electronics system of a motor vehicle, which is controlled by the microprocessor.

For improving this dynamic behavior, the current source $S_1$ is provided. It effects a biasing current in the transistors $T_2$, $T_3$ and $T_4$, through which the semiconductor junctions of these transistors are supplied with current and the internal diffusion and depletion layer capacitances thereof are charged. Thus, upon reaching of the limit voltage the limitation effect of the circuit takes place without the delay criticized hereinbefore.

When no additional measures are taken, this solution involves the disadvantage that the following input current results when V=0:

$$I(V = 0) = -I_o \frac{1}{\frac{1}{ab} - 1}, \ ab < 1. \tag{6}$$

This input current is to be as low as possible when V=0, for instance <1 μA, in order to be in the blocking range SP of the voltage limiting circuit as close as possible, to the ideal condition of an input current O and an internal resistance infinite.

As can be gathered from equation (6), the demanded infinitesimal input current I when V=0 can by achieved either by a low current Io of the current source $S_1$ or by a small product of a·b.

However, the solution with a low current Io is in contradiction to the above requirement of a sufficient biasing current for providing a short response time of the voltage limiting circuit. Besides, problems with respect to circuit technology arise when current sources are to be realized having output currents in the range of <1 μA.

The solution with a small product a·b cannot be realized, either, in an advantageous manner in integrated circuits, since this can be realized only by extremely differing ratios of the areas of the current mirror transistors. Technological reasons necessitate a minimum area for the current mirror transistor having the smaller emitter area, so that in case of extreme area ratios, a very great area is required for the current mirror transistor having the larger emitter area.

In the voltage limiting circuit according to the invention, this problem is overcome by employing the auxiliary voltage source H. By means of the auxiliary voltage Vo of the auxiliary voltage source H, the input or clamping transistor $T_1$ is negatively biased with respect to transistor $T_2$ which is connected as a diode. Due to the auxiliary voltage Vo, the input current calculated hereinbefore in equation (6) for V=0 occurs only at −Vo:

$$I(V = -V_o) = -I_o \frac{1}{\frac{1}{ab} - 1}, \ ab < 1. \tag{7}$$

However, when V=0, the following holds in this case:

$$I(V = 0) = -I_o \frac{1}{\frac{e^{V_o/V_T}}{ab} - 1} \tag{8}$$

wherein $V_T$ is the temperature voltage $V_T = k \cdot T/e$; it is approx. 26 mV at room temperature.

The critical regenerative feedback of the ring circuit including the two current mirror circuit starts in this case only with a more negative input voltage:

$$V = V_K = -(V_T \ln (a \cdot b) + V_o) \tag{9}$$

Due to the fact that the auxiliary voltage Vo in equation (8) is exponentially active, it can take over that function for reducing the input current which was to be achieved in equation (6) with a small product a·b. The transistor geometry may therefore remain within the limits of ratios of size that are justifiable for practical application, and the current Io may nevertheless maintain a value that is sufficient for a fast response.

Thus, by means of the combination of the ring circuit including the two current mirror circuits, the auxiliary voltage source and the current source, a relatively sharp-edged and rapid limitation onset is achieved, with the auxiliary voltage source additionally providing the possibility of a simple determination of the desired limitation threshold.

Figure 4:
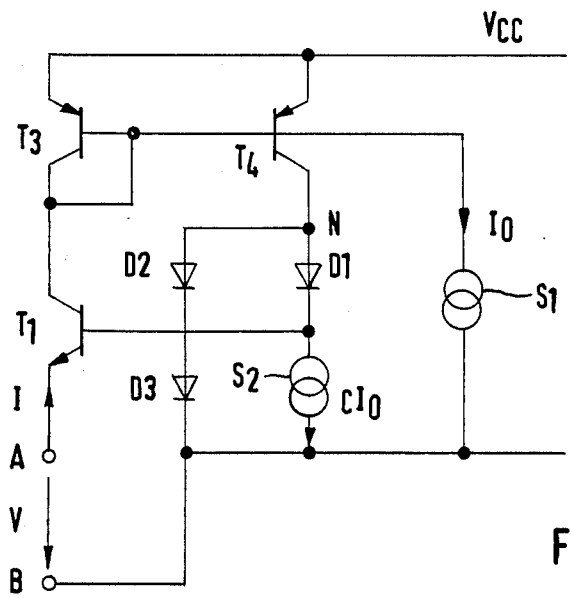
FIG. 4 illustrates a second embodiment of the voltage limiting circuit according to the invention.

As regards monolithically integrated realizations of the voltage limiting circuit according to the invention, the embodiment shown in FIG. 4 is preferred in which the auxiliary voltage is generated by unequal voltage drops across diodes that are operated with different current densities. In this embodiment the clamping transistor $T_1$, the upper current mirror circuit $T_3$, $T_4$ and the first current source $S_1$ are provided in the same manner as in the embodiment according to FIG. 3, these parts being marked with the same reference characters. The transistor $T_2$ which is connected as a diode and the auxiliary voltage source H of the embodiment of FIG. 3 are replaced in the embodiment of FIG. 4 by a circuit network having three diodes $D_1$ to $D_3$, and by a second current source $S_2$. The first diode $D_1$ is connected between the base of clamping transistor $T_1$ and a circuit node N that is connected to the collector of $T_4$. The second diode $D_2$ and the third diode $D_3$ are located in a series connection disposed between the circuit node N and the circuit point B. The second current source $S_2$ is connected between the base of clamping transistor $T_1$ and the circuit point B.

This embodiment utilizes the phenomenon that of two diodes operated with a different current density, the diode operated with the larger current density displays a greater voltage drop. The current density can be influenced by the diode area and/or by the current passed through the diode.

The reason therefor is that, as it is generally known, the following holds for the differential voltage of two diodes:

$$V_{D1} - V_{D2} = V_T \cdot \ln\frac{I_{D1} A_{D2}}{A_{D1} I_{D2}} \tag{10}$$

wherein $I_{D1}$ and $I_{D2}$ are the diode currents and $A_{D1}$ and $A_{D2}$ are the diode areas of diodes $D_1$ and $D_2$, respectively. At room temperature the differential voltage obtained is approx. 60 mV with a current density ratio of 10:1.

When the limiting circuit in FIG. 4 is again considered with respect to the input condition $V=0$, the same voltage drops are present on the one hand on the series connection of the diode $D_1$ and the base-to-emitter path of $T_1$ and on the other hand on the series connection containing the diodes $D_2$ and $D_3$. When measures are taken that the base-to-emitter diode of $T_1$ has a clearly lower current density than diodes $D_1$ to $D_3$, then it is possible, on the basis of the resulting differential voltage that acts as auxiliary voltage Vo, to reduce the current $I(V=0)$ according to equation (8), without the remaining properties being deteriorated thereby. For achieving this, the voltage drop across diodes $D_2$ and $D_3$ must be made small, and the voltage drop across diode $D_1$ must be made large.

When basing the following deliberations on the area ratio a according to equation (2), the collector current of transistor $T_4$ is:

$$IC_{T4} = (I+Io)\cdot a. \tag{11}$$

This current flows into circuit node N and there divides into the current portions $I_{D1}$ and $I_{D2}$. However, current portion $I_{D1}$ is predetermined by the current cIo of the second current source $S_2$, so that a current of $$I_{D2,3} = IC_{T4} - cIo \tag{12}$$

flowing through diodes $D_2$ and $D_3$ results.

At transistor $T_1$, one obtains the following relation with the base-to-emitter voltage when $V=0$:

$$V_{BE,T1} + V_{D1} - V_{D2} - V_{D3} = 0. \tag{13}$$

Thus it follows therefrom:

$$\frac{I}{A_{T1}} \cdot \frac{cIo}{A_{D1}} \cdot \frac{A_{D2}}{(I+Io)a - cIo} \cdot \frac{A_{D3}}{(I+Io)a - cIo} = 1. \tag{14}$$

As stated hereinbefore, an object to be met by the auxiliary voltage source H is to have the input current I become as low as possible relative to the biasing current Io when there is an input voltage of $V=0$. It is therefore admissible to neglect I in relation to Io, so that the following holds:

$$I(V=0) \cong I_O \frac{(a-c)^2}{c} \cdot \frac{A_{T1} A_{D1}}{A_{D2} A_{D3}}, \ a > c. \tag{15}$$

The condition $a > c$ is a technical requirement in order to have a finite current flow across the diodes in the forward direction.

The following example is to elucidate the effectiveness of the circuit measures employed in this embodiment. When
 $a=1$
 $c=0.8$
 $A_{T1}=1$
 $A_{D1}=1$
 $A_{D2}=5$
 $A_{D3}=5$
one obtains $$I(V=0) \cong Io \cdot 0.002.$$

In comparison therewith, if the auxiliary voltage source H in FIG. 3 or the auxiliary voltage formed with the diode network $D_1$ to $D_3$ in FIG. 4 were not used, it would be necessary for achieving the same current ratio of I/Io to realize, when $a=1$, an area ratio of $$\frac{A_{T2}}{A_{T1}} = 500$$

for the transistors $T_1$ and $T_2$, which is not feasible and furthermore would considerably deteriorate the dynamic behavior of the limiting circuit. For, with emitter areas of such dimensions, the capacitances arising are also huge.

There are various possibilities for driving the bridge circuit $D_1$, $T_1$, $D_2$, $D_3$. In principle it must be ensured that the diodes $D_2$ and $D_3$ are operated with a low current density in order to generate a low voltage drop across these diodes. This can be achieved by using diodes $D_2$ and $D_3$ of large area and by applying a low current thereto. In contrast thereto, the transistor $T_1$ and the diode $D_1$ should have smaller areas, and the diode $D_1$ should be operated with a current that is increased as compared to the current flowing through diodes $D_2$ and $D_3$ so as to achieve a comparatively large voltage drop across diode $D_1$. The base-to-emitter voltage of $T_1$ resulting therefrom then becomes low, which leads to a reduction of the input current I.

Figure 5:
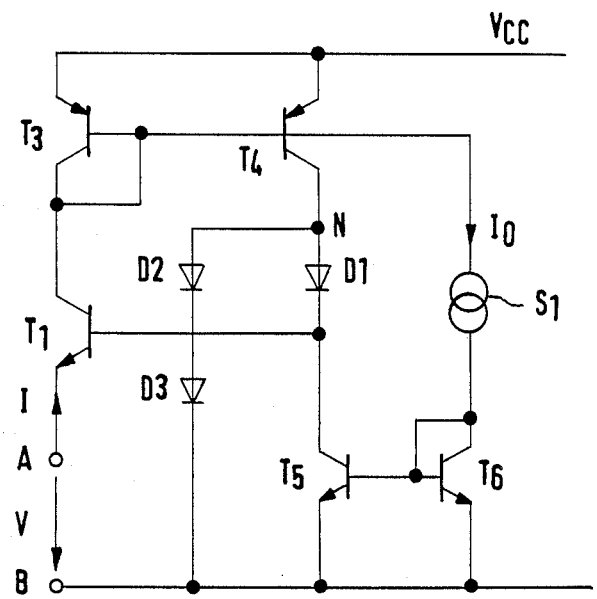
FIG. 5 illustrates a third embodiment of the voltage limiting circuit according to the invention.

FIG. 5 shows an embodiment of the voltage limiting circuit according to the invention in which the second current source $S_2$ is realized through a third current mirror circuit having a transistor $T_5$ that is connected between the first diode $D_1$ and the circuit point B, as well as a transistor $T_6$ that is operated as a diode and connected between the first current source $S_1$ and the circuit point B. As for the rest, the circuit according to FIG. 5 is identical with the circuit shown in FIG. 4.

The ratio of the emitter areas of transistors $T_5$ and $T_6$ is set to be c:

$$\frac{A_{E,T5}}{A_{E,T6}} = c. \tag{16}$$

Figure 6:
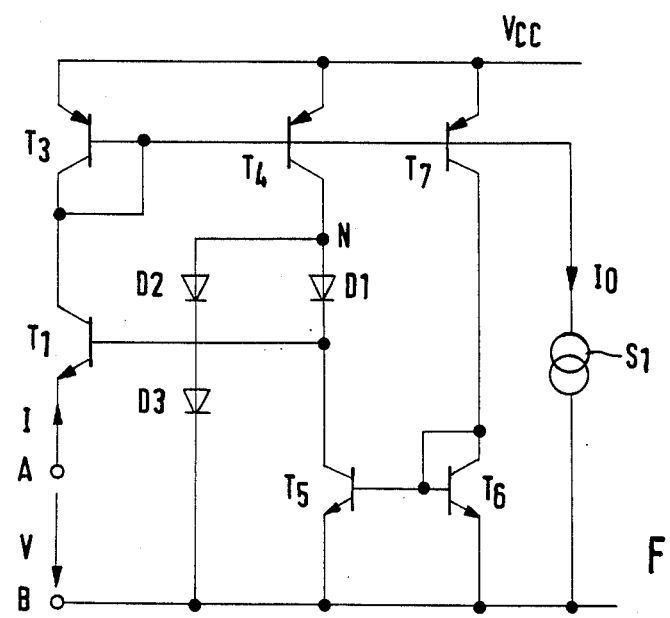
FIG. 6 illustrates a fourth embodiment of the voltage limiting circuit according to the invention.

FIG. 6 indicates an embodiment of the voltage limitation circuit of the invention which represents a modification of the embodiment shown in FIG. 5 with respect to the circuit connection of the third current mirror circuit and the first current source $S_1$. In FIG. 6, the current source $S_1$ is not connected in series to the collector of the current mirror transistor $T_6$, but the collector of $T_6$ is connected via the emitter-to-collector path of an additional transistor $T_7$ to the supply voltage Vcc. The base of $T_7$ is connected on the one hand to the base terminals of transistors $T_3$ and $T_4$ of the second current mirror circuit and on the other hand to the first current source $S_1$. As for the rest, the circuit according to FIG. 6 is identical with the circuit shown in FIG. 5.

As mentioned hereinbefore, a corresponding circuit for limiting positive input voltages to $V=V_{MAX}$ can be realized in that all npn transistors are replaced by pnp transistors, and vice versa. The supply voltage Vcc then serves as a reference potential. When a limiting circuit is required that provides limitation in case of negative input voltages $V_{MIN}$ as well as in case of positive input voltages $V_{MAX}$, it is possible to combine two voltage limiting circuits according to the invention which have opposite transistor types.

When employing standard npn transistors with a transition frequency of approx. 300 MHz for the integration of the voltage limiting circuit and when replacing the slow lateral pnp transistors by vertical pnp transistors (with insulated collector), it is possible to achieve response times of the circuit of less than 10 ns.

When employing suitable technologies, the diodes $D_2$ and $D_3$ may be designed as Schottky diodes.

The principles, preferred embodiments and modes of operation of the present invention have been described in the foregoing specification. The invention which is intended to be protected herein, however, is not to be construed as being limited to the particular forms disclosed, since these are to be regarded as illustrative rather than restrictive. Variations and changes may be made by those skilled in the art without departing from the spirit of the invention.

What is claimed is:

1. A voltage limiting network for connection across a voltage source, comprising:
    a first current mirror circuit including a clamping transistor and diode means, said clamping transistor having a first clamping transistor terminal connected to one pole of the voltage source, and said diode means having a first diode means terminal connected to another pole of the voltage source;
    a second current mirror circuit having a transistor and diode means and being connected with said first current mirror circuit in a ring circuit, said second current mirror circuit being connected on a supply side to a supply voltage source;
    first current source means for supplying a biasing current effecting short response times to said transistor and said diode means of said second current mirror and to said diode means of said first current mirror; and
    auxiliary voltage source means connected with a control electrode of said clamping transistor, said auxiliary voltage source means providing a voltage having an amplitude such that when said voltage limiting network is in a non-limiting state, an input current which is smaller than said biasing current flows in said voltage limiting network.

2. A voltage limiting circuit according to claim 1, wherein said first current source means is connected between said another pole of the voltage source and a connection between the transistor and the diode means of the second current mirror circuit.

3. A voltage limiting circuit according to claim 1, wherein product a·b of an area ratio a between active semiconductor areas of the diode means and an emitter of said transistor of the second current mirror circuit and an area ratio b between active semiconductor areas of an emitter of said clamping transistor and the diode means of the first current mirror circuit is less than 1.

4. A voltage limiting circuit according to claim 1, wherein the auxiliary voltage source is formed by a diode means connected to the control electrode of the clamping transistor and by a diode series connection which is connected between a terminal of the diode means not connected to the clamping transistor and said another pole of the voltage source and which includes at least a second and a third diode, and wherein means are provided for realizing such voltage drops across the diode means and the diode series connection that a voltage difference between a voltage drop across the diode means effects such a base-to-emitter voltage on the clamping transistor that, when said voltage limiting network is in a non-limiting state, the input current is considerably smaller than the biasing current.

5. A voltage limiting circuit according to claim 4, wherein
    the diodes of the auxiliary voltage source which constitute the diodes means and the diode series connection at the same time constitute the diode means of the first current mirror circuit.

6. A voltage limiting circuit according to claim 4, wherein
    at least one of the diodes of the diode series connection has an active semiconductor area which is large in comparison with the active semiconductor area of the diode means.

7. A voltage limiting circuit according to claim 4 wherein
    the diode means is acted upon by a larger current than the diode series connection.

8. A voltage limiting circuit according to claim 7, wherein a second current source is connected between the terminal of the diode means connected to the clamping transistor and said another pole of the voltage source, said second current source delivering a fraction c of the current of the first current source.

9. A voltage limiting circuit according to claim 8, wherein a third current branch connected in series with the first current source means and with a second current branch connected between the terminal of the diode means connected to the clamping transistor and said another pole of the voltage source a ratio between the active semiconductor areas of the current mirror elements of the third current mirror Circuit that are provided in the two current branches being c.

10. A voltage limiting circuit according to claim 8, wherein a third current mirror circuit is provided with one current branch connected between the terminal of the diode means connected to the clamping transistor and said another pole of the voltage source, and with a second current branch connected to the supply voltage source via the main path of an additional transistor having a control electrode connected on the one hand to control electrodes of the two current mirror elements of the second current mirror circuit and on the other hand to the first current source means.

11. A voltage limiting circuit according to claim 1 wherein
    the transistors of the second current mirror circuit are of a conductivity type that is complementary to that of the transistors of the first current mirror circuit.

12. A voltage limiting circuit according to claim 1, wherein
    for limiting negative voltage values, npn transistors are used for the first current mirror circuit and pnp transistors are used for the second current mirror circuit.

13. A voltage limiting circuit according to claim 1, wherein for limiting positive voltage values, pnp transistors are used for the transistors of the first current mirror circuit and npn transistors are used for the second current mirror circuit and an negative auxiliary voltage is employed.

14. A voltage limiting circuit according to claim 4, wherein the diode means and/or the diode series connection comprise at least one Schottky diode.

15. A voltage limiting circuit according to claim 12, further including:

a third current mirror circuit including a clamping transistor and diode means, said clamping transistor of said third current mirror circuit having a first clamping transistor terminal connected to one pole of the voltage source, and said diode means of said third current mirror circuit having a first diode means terminal connected to another pole of the voltage source;

a fourth current mirror circuit having a transistor and diode means and being connected with said third mirror circuit being connected on a supply side to a supply voltage source;

said current source means supplying a biasing current effecting short response times to said transistor and said diode means of said fourth current mirror and to said diode means of said third current mirror; and said auxiliary voltage source means being connected with a control electrode of said clamping transistor of said third current mirror circuit, said auxiliary voltage source means providing a negative voltage having an amplitude such that when said voltage limiting network is in a non-limiting state, an input current which is smaller than said biasing current flows in said voltage limiting network.

* * * * *